United States Patent
Ganeshkumar (10) Patent No.: US 9,934,788 B2
(45) Date of Patent: Apr. 3, 2018

(54) REDUCING CODEC NOISE IN ACOUSTIC DEVICES

(71) Applicant: Bose Corporation, Framingham, MA (US)

(72) Inventor: Alaganandan Ganeshkumar, North Attleboro, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/225,406

(22) Filed: Aug. 1, 2016

(65) Prior Publication Data
US 2018/0033445 A1    Feb. 1, 2018

(51) Int. Cl.
*G10L 19/16* (2013.01)
*G10L 19/10* (2013.01)
*H03G 7/00* (2006.01)

(52) U.S. Cl.
CPC ............ *G10L 19/167* (2013.01); *G10L 19/10* (2013.01); *H03G 7/007* (2013.01); *H04R 2420/07* (2013.01)

(58) Field of Classification Search
CPC .... G06F 3/167; G06F 17/30867; G06F 3/165; G06F 17/2785; G10L 15/22; G10L 15/02; G10L 15/197; G10L 25/51; G10L 15/265; G10L 17/22; G10L 2015/088; G10L 25/48; G10L 2015/228; G10L 19/008; G10L 19/0204; G10L 19/0208; G10L 15/063; G10L 15/1815; G10L 19/005; G10L 19/025; G10L 19/167; G10L 2015/025; G10L 2015/223; G10L 2021/02166; G10L 21/02
See application file for complete search history.

(56) References Cited

U.S. PATENT DOCUMENTS 5,925,146 A * 7/1999 Murata ................ H04B 14/068
714/708
6,816,592 B1 * 11/2004 Kirla ........................ H04B 3/23
370/289

(Continued)

FOREIGN PATENT DOCUMENTS

EP           0 481 626      4/1992
WO      WO 2015/144674    10/2015

OTHER PUBLICATIONS

ITU G.722 Codec Standards; [retrieved on Nov. 3, 2016];Retrieved from the Internet: http://www.itu.int/rec/T-REC-G.722/e; 1 page.

(Continued)

*Primary Examiner* — Mohammad Islam
(74) *Attorney, Agent, or Firm* — Fish & Richardson P.C.

(57) ABSTRACT

The technology described in this document can be embodied in a computer-implemented method that includes receiving, at a first acoustic device, a representation of an audio signal, and amplifying the representation of the audio signal by a first gain factor to generate an amplified input signal. The method also includes processing the amplified input signal by an audio codec that includes one or more processors to generate a processed signal that represents a portion of the audio signal to be output by a second acoustic device. The processed signal includes noise originating at the audio codec. The method further includes transmitting the processed signal to the second acoustic device.

25 Claims, 10 Drawing Sheets

(56) References Cited

U.S. PATENT DOCUMENTS

| | | | | |
|---|---|---|---|---|
| 2003/0104842 A1* | 6/2003 | Choi | ............ | H04M 1/05 455/569.1 |
| 2008/0260168 A1* | 10/2008 | Chen | ............ | H04M 1/6008 381/57 |
| 2010/0081487 A1* | 4/2010 | Chen | ............ | G10L 21/0208 455/575.1 |
| 2012/0058727 A1* | 3/2012 | Cook | ............ | H04R 5/02 455/41.3 |
| 2012/0087515 A1* | 4/2012 | Poulsen | ............ | H03F 3/187 381/104 |
| 2012/0232912 A1* | 9/2012 | Tammi | ............ | G10L 19/008 704/502 |
| 2014/0056451 A1* | 2/2014 | El-Hoiydi | ............ | H04R 25/554 381/315 |
| 2014/0126745 A1* | 5/2014 | Dickins | ............ | H04R 3/002 381/94.3 |
| 2014/0270231 A1* | 9/2014 | Dusan | ............ | G10L 25/90 381/74 |
| 2015/0156598 A1* | 6/2015 | Sun | ............ | H04L 12/1822 348/14.07 |
| 2015/0379992 A1* | 12/2015 | Lee | ............ | G10L 15/22 704/275 |
| 2016/0080868 A1 | 3/2016 | Hensen | | |
| 2017/0164107 A1* | 6/2017 | Murgia | ............ | H04R 3/005 |

OTHER PUBLICATIONS

NXP Semiconductor Reference [retrieved on Nov. 3, 2016]; Retrieved from the Internet http://www.nxp.com/products/interface-andconnectivity/wireless-connectivity/nfmi-radiosolutions/nfmi-radio-for-wireless-audio-anddata-streaming:NXH2280UK; 2 pages.

Maddams et al.; "An Autonomous Method for Multi-Track Dynamic Range Compression"; Proc. of the 15$^{th}$ Int. Conference on Digital Audio Effects (DAFx-12), York, UK Sep. 17-21, 2012; 8 pages.

International Search Report and Written Opinion; PCT/US2017/042929; dated Oct. 6, 2017; 11 pages.

* cited by examiner

REDUCING CODEC NOISE IN ACOUSTIC DEVICES

TECHNICAL FIELD

This disclosure generally relates to acoustic devices that employ audio codecs for encoding and decoding audio signals.

BACKGROUND

Acoustic devices such as wireless earphones or headphones can include audio codecs for encoding and decoding audio signals. In some cases, an audio codec may act as a noise source by introducing noise in the signal processed by the codec.

SUMMARY

In one aspect, this document features a computer-implemented method that includes receiving, at a first acoustic device, a representation of an audio signal, and amplifying the representation of the audio signal by a first gain factor to generate an amplified input signal. The method also includes processing the amplified input signal by an audio codec that includes one or more processors to generate a processed signal that represents a portion of the audio signal to be output by a second acoustic device. The processed signal includes noise originating at the audio codec. The method further includes transmitting the processed signal to the second acoustic device.

In another aspect, this document features a system that includes a first acoustic device configured to receive a representation of an audio signal. The first acoustic device includes an amplifier configured to amplify the representation of the audio signal by a first gain factor to generate an amplified input signal. The first acoustic device also includes an audio codec having one or more processors, the audio codec configured to process the amplified input signal to generate a processed signal that represents a portion of the audio signal to be output by a second acoustic device. The processed signal includes noise originating at the audio codec. The first acoustic device also includes a transmitter for transmitting the processed signal to the second acoustic device.

In another aspect, this document features a machine-readable storage device having encoded thereon computer readable instructions for causing one or more processors to perform various operations. The operations include receiving a representation of an audio signal, and amplifying the representation of the audio signal by a first gain factor to generate an amplified input signal. The operations also include processing the amplified input signal to generate a processed signal that represents a portion of the audio signal to be output by an acoustic device, and providing the processed signal for transmission to the acoustic device. The processed signal includes noise originating at an audio codec.

Implementations of the above aspects may include one or more of the following features.

A representation of the processed signal may be received at the second acoustic device, where the first gain factor can be compensated for by amplifying the representation of the processed signal by a second gain factor to generate a compensated signal. The compensated signal can be outputted at the second acoustic device. The second gain factor can be substantially an inverse of the first gain factor. The audio codec can be an adaptive differential pulse code modulation (ADPCM) codec. The processed signal can also include noise originating at an asynchronous sample rate converter used in conjunction with the audio codec. The first gain factor can be selected such that the amplified input signal does not exceed a dynamic range of a system in which the audio codec is disposed. The amplified input signal can be compressed in accordance with a dynamic range of a system in which the audio codec is disposed. The first gain factor can be selected adaptively in accordance with the received representation of the audio signal. A dynamic range of the received representation of the audio signal can be detected, and an available dynamic range headroom can be determined as a difference between a dynamic range of the system, and the dynamic range of the received representation of the audio signal. The first gain factor can be selected such that an associated amount of amplification does not exceed the available dynamic range headroom. The information indicative of the adaptively selected gain factor can be transmitted to the second acoustic device. The first and second acoustic devices can be earphones that are connected to one another over a wireless link. The first gain factor is a function of frequency.

Various implementations described herein may provide one or more of the following advantages.

By pre-processing an input signal to a codec by applying a gain factor, and compensating for the additional gain at the output of the codec, the effect of codec-introduced noise may be mitigated, thereby reducing the need for computationally intensive noise reduction techniques. This in turn may improve the performance of codecs used for satisfying bandwidth requirements in transmitting audio signals from one acoustic earbud to another over a wireless channel. In addition, by adjusting the gain factor in accordance with available dynamic range headroom, any signal degradation due to a limitation in the number of bits of the codec may be mitigated. This in turn may be used to support higher dynamic range content (e.g., high dynamic range music) without having unacceptable levels of degradation in audio quality.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

Wireless acoustic earbuds that are connected to one another, as well as to a source device (e.g., a phone, tablet, or other media player), over respective wireless channels have become popular as personal audio devices for various reasons such as aesthetic appeal and ease of use during various activities. The popularity of such acoustic systems is in part attributable to the lack of wires connecting the various components of the system. The lack of wired connections however creates other challenges, such as maintaining quality of the audio signals transmitted between the components. For example, transmitting audio signals from one acoustic earbud to another through a low energy wireless channel established through the head of the user can be particularly challenging. In some implementations, this may entail additional processing by audio codecs such as ITU G.722. Such codecs can compress the bit rate of audio signals, but sometimes at the cost of introducing codec-generated noise and/or adversely affecting the dynamic range of the audio signals. This document describes various technologies for improving the quality of audio signals, for example, by reducing adverse effects of codec generated noise, and/or by reducing adverse effects of bit rate compression on dynamic ranges of the signals.

The two different types of compression described should not confused with one another. The first type, which may also be referred to as audio compression, is a data compression technique used for generating compressed audio. Audio compression involves reducing the amount of data corresponding to audio waveforms to different degrees (e.g., depending on types of audio compression processes, and/or whether the audio compression is lossy or lossless) for transmission with or without some loss of quality. The data reduction can be performed, for example, by a codec by leveraging information redundancy in the audio data, using methods such as coding, pattern recognition, and linear prediction to reduce the amount of information used to represent the uncompressed audio data. The second type of compression is an audio level compression, in which the difference between a loud portion and a quiet portion of an audio waveform is reduced, for example, by compressing or reducing the number of bits used for representing the audio waveform. The range of audio levels that may be represented using a given number of bits used in a system can be referred to as the dynamic range of the system. In some implementations, a single codec may perform both types of compressions described above.

Figure 1:
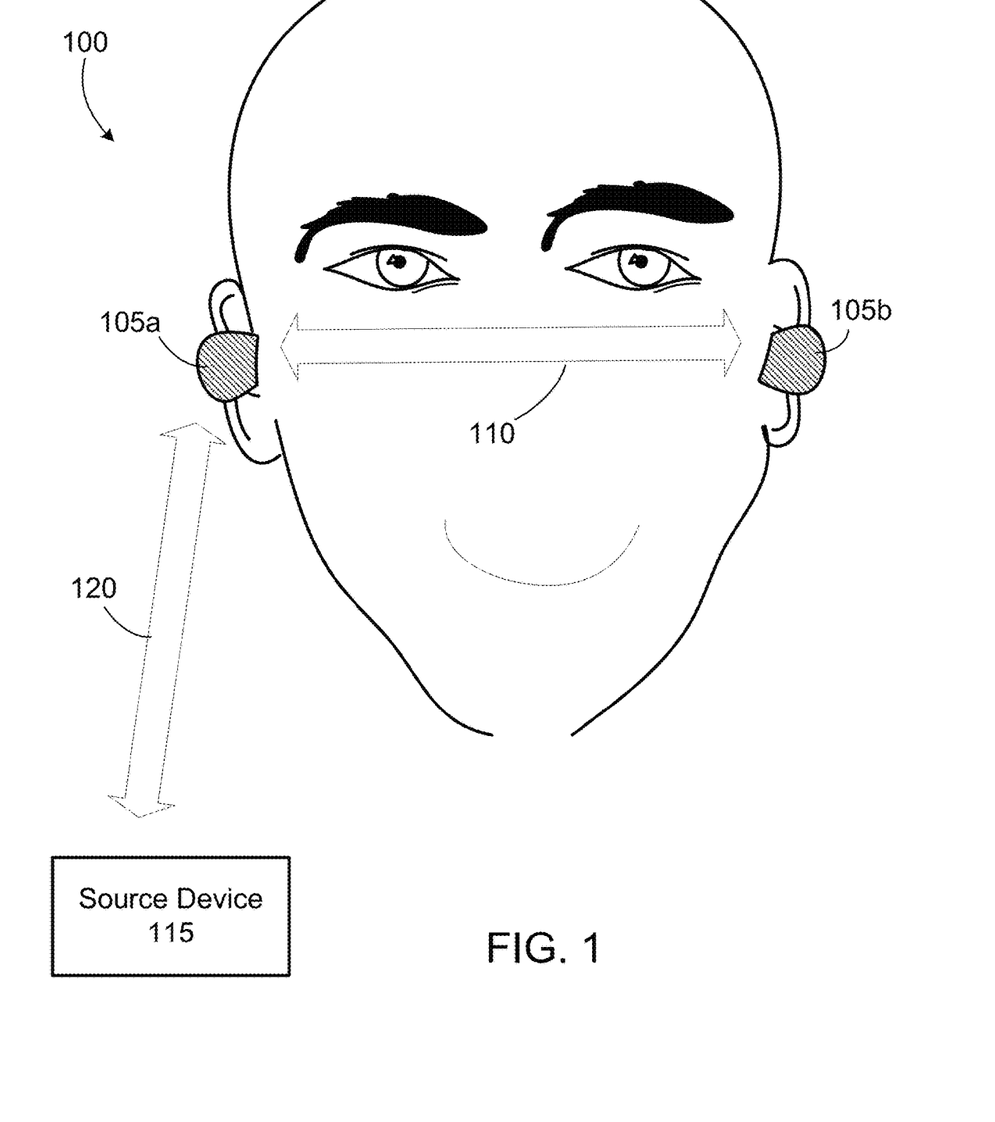
FIG. 1 depicts a schematic diagram illustrating signal paths in an example system that includes a set of wireless acoustic earbuds receiving audio from a source device.

A schematic example of system 100 including two wireless acoustic earbuds is shown in FIG. 1. The system 100 includes a set of two acoustic earbuds (105a, 105b, 105 in general) that are connected to one another over a wireless link 110. At least one of the acoustic earbuds is connected to a source device 115 that generates audio signals to be output by the earbuds 105. The connection between an earbud 105 and the source device 115 can be over a wireless channel 120 such as a Bluetooth® or Wi-Fi link. Because the wireless channel 120 is established over the environment, a latency associated with the channel 120 can depend on various factors such as a physical length of the channel or one or more environmental parameters that affect data transmission over the channel. Accordingly, transmitting audio signals separately to the two earbuds 105 may result in a latency mismatch. In some implementations, the latency mismatch can be addressed by transmitting audio signals to one of the earbuds (105a in the example of FIG. 1), which then transmits at least a portion of the audio signals to the second earbud (105b in the example of FIG. 1). This situation is depicted in the example of FIG. 1, where the source device 115 transmits audio signals over the wireless channel 120 to the earbud 105a, which then transmits a portion of the received signal to the earbud 105b over the wireless link 110.

The example of FIG. 1 shows the two earbuds 105a and 105b as discrete in-ear devices. However, the terms earbud or acoustic earbud, as used in this document, include various types of other personal acoustic devices such as in-ear, around-ear or over-the-ear headsets, earphones, and hearing aids. The earbuds 105 may be physically tethered to each other, for example, by a cord, an over-the-head bridge or headband, or a behind-the-head retaining structure.

The earbud that receives the signal from the source device 115 can be referred to as a master, while the other earbud can be referred to as a slave. In some implementations, one of the earbuds can always function as the master while the other earbud always functions as the slave. In other implementations, the master earbud can be selected based on one or more criteria such as signal strength. For example, if a user places the source device (e.g., a smartphone) 115 in his left pocket, the left earbud may receive a stronger signal than the right earbud, and therefore be selected as the master. If the user puts the source device 115 in the right pocket, or another location where the right earbud receives a stronger signal, the roles of the master and slave may be reversed.

The source device 115 can include any device capable of generating audio signals and transmitting them to the earbuds 105. For example, the source device 115 can be a mobile device such as a smartphone, a tablet computer, an e-reader, or a portable media player. The source device 115 can also be a portable or non-portable media playing device such as a TV, a disk-player, a gaming device, a receiver, a media streaming device, or a set-top box. In some implementations, the source device 115 can be an intermediate device (e.g., a remote controller) that interfaces between a media player and the earbuds 105. In some implementations, the source device 115 can be a hearing assistance device.

In some implementations, the source device 115 includes a transceiver that can establish the wireless channel 120. In some implementations, the wireless channel 120 is established in accordance with a Bluetooth® Basic Rate/Enhanced Data Rate (BR/EDR) or Bluetooth® Low Energy (BLE) connections. For brevity, Bluetooth® Basic Rate/Enhanced Data Rate (BR/EDR) is interchangeably referred to herein as Bluetooth®. In some implementations, the wireless channel 120 is established in accordance with another communication protocol such as Near Field Communications (NFC), IEEE 802.11, or other local area network (LAN) or personal area network (PAN) protocols. In some implementations, the wireless channel 120 may support full bandwidth audio such as 48 KHz music.

The wireless link 110 is a link established between two acoustic devices such as the two earbuds 105. Examples of technologies that may be used in establishing the wireless link 110 include Near-Field Magnetic Induction (NFMI), Bluetooth®, BLE, Wi-Fi, or another personal area network (PAN) protocol such as body area network (BAN), ZigBee, or INSTEON. In some implementations, such as for wireless earbuds, at least a portion of the wireless link 110 is established through a human head. In some implementations, the data transfer capacity of the wireless link 110 can be less than that of the wireless channel 120, thereby requiring additional processing at the master device. The additional processing can include audio compression that may be performed, for example, by an audio codec. The additional processing can also include audio level compression, including, for example, adjusting a dynamic range of the transmitted audio signals such that the signals can be transmitted using a lower number of bits.

Figure 2:
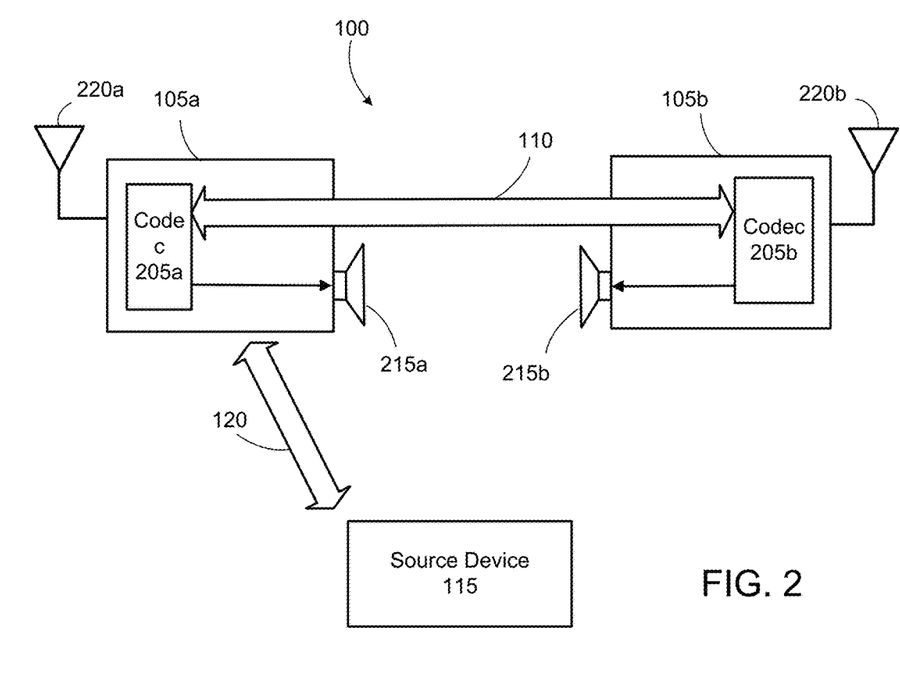
FIG. 2 is a block diagram of the system depicted in FIG. 1.

FIG. 2 is a block diagram of the system 100, the block diagram illustrating codecs 205a and 205b (205, in general) in the earbuds 105a and 105b, respectively. The earbuds 105a and 105b also include acoustic transducers 215a and 215b, respectively, for generating audio output, and one or more receivers 220a and 220b, respectively, for receiving signals from the source device 115. In some implementations, where the wireless channel 120 is a Bluetooth® connection, the audio signals can be transmitted from the source device 115 using, for example, a Bluetooth® profile such as Advanced Audio Distribution Profile (A2DP). An A2DP profile can allow transfer of an audio stream in up to 2 channel stereo, from the source device 115 to the master earbud 105a. In some implementations, the A2DP stream can be encoded using codecs such as a sub-band coding (SBC) codec or Advanced Audio Coding (AAC) codec. In some implementations, other Bluetooth® profiles such as Generic Audio/Video Distribution Profile (GAVDP) can also be used in place of A2DP.

Audio signals received at the master earbud (105a, in this example) from the source device 115 over the wireless channel 120 can be processed by the codec 205a and output through a corresponding acoustic transducer 215a. The codec 205a can also process at least a portion of the audio signal and transmit the processed portion to the slave earbud (105b, in this example) over the wireless link 110. At the slave side, the slave codec 205b then processes the received signal and generates audio output through the corresponding acoustic transducer 215b.

The codec 205 can be of various types. In some implementations, the codec 205 can be an Adaptive Differential Pulse-Code Modulation (ADPCM) codec such as the ITU G.722 codec. The ITU G.722 is a wideband audio codec that can be configured to operate at 48, 56 and 64 kbit/s. Other examples of codecs that may be used include SBC codec, FastStream, and APTx. In some implementations, the codecs can be implemented on a processing device such as a digital signal processing (DSP) chip or a System-on-Chip (SoC). An example of a SoC includes CSR 8670 developed by CSR plc., a subsidiary of Qualcomm Inc. If a DSP or SoC is included in the earbuds 105, additional processing of the audio stream received over the wireless channel 120 can be performed before transmitting a portion of the received stream over the wireless link 110.

In some cases, using a codec 205 can pose challenges. For example, an ADPCM codec such as the G.722 may add internally generated noise to the signal processed by the codec. This may be manifested, for example, as a broadband residual noise at the output of the codec. This is often referred to as codec noise or codec-generated noise, and may degrade the listening experience, particularly at low volume levels. In addition, the bit rate compression carried out by the codec 205 may result in a dynamic range reduction of the audio signal, which in turn may be manifested as a perceived loss of audio quality. As an example, a G.722 codec typically generates audio samples of 14 bits to reduce the transmitted bit rate. This equates to about 12 dB of dynamic range reduction as compared to the 16 bit samples of audio that may be received over the wireless channel 120. In some implementations, the technology described herein may be used to reduce the adverse effects due to the codec noise and dynamic range reduction issues associated with the use of a codec 205.

Figure 3A:
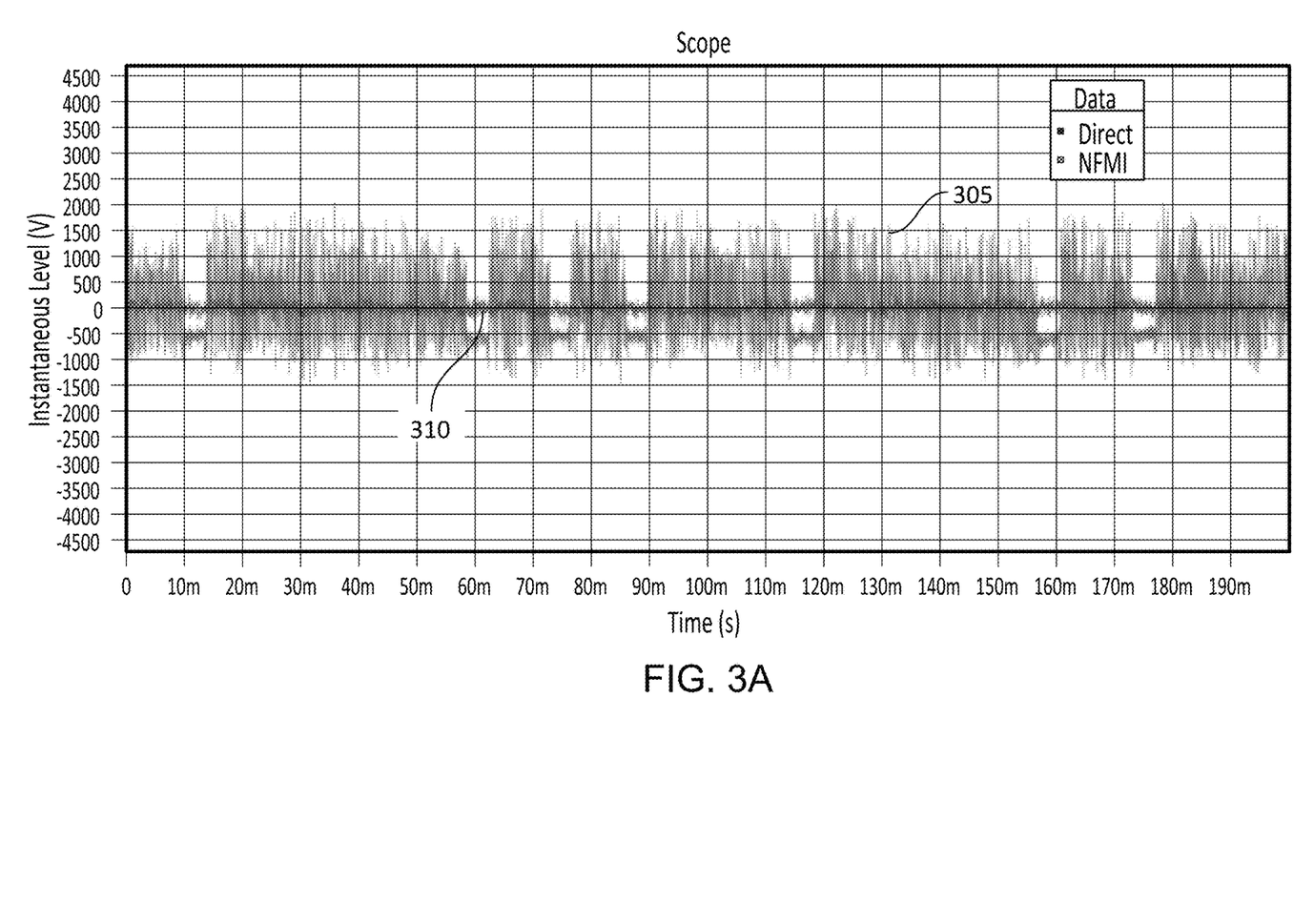
FIGS. 3A and 3B show plots illustrating degradation of signal due to codec noise.
Figure 3B:
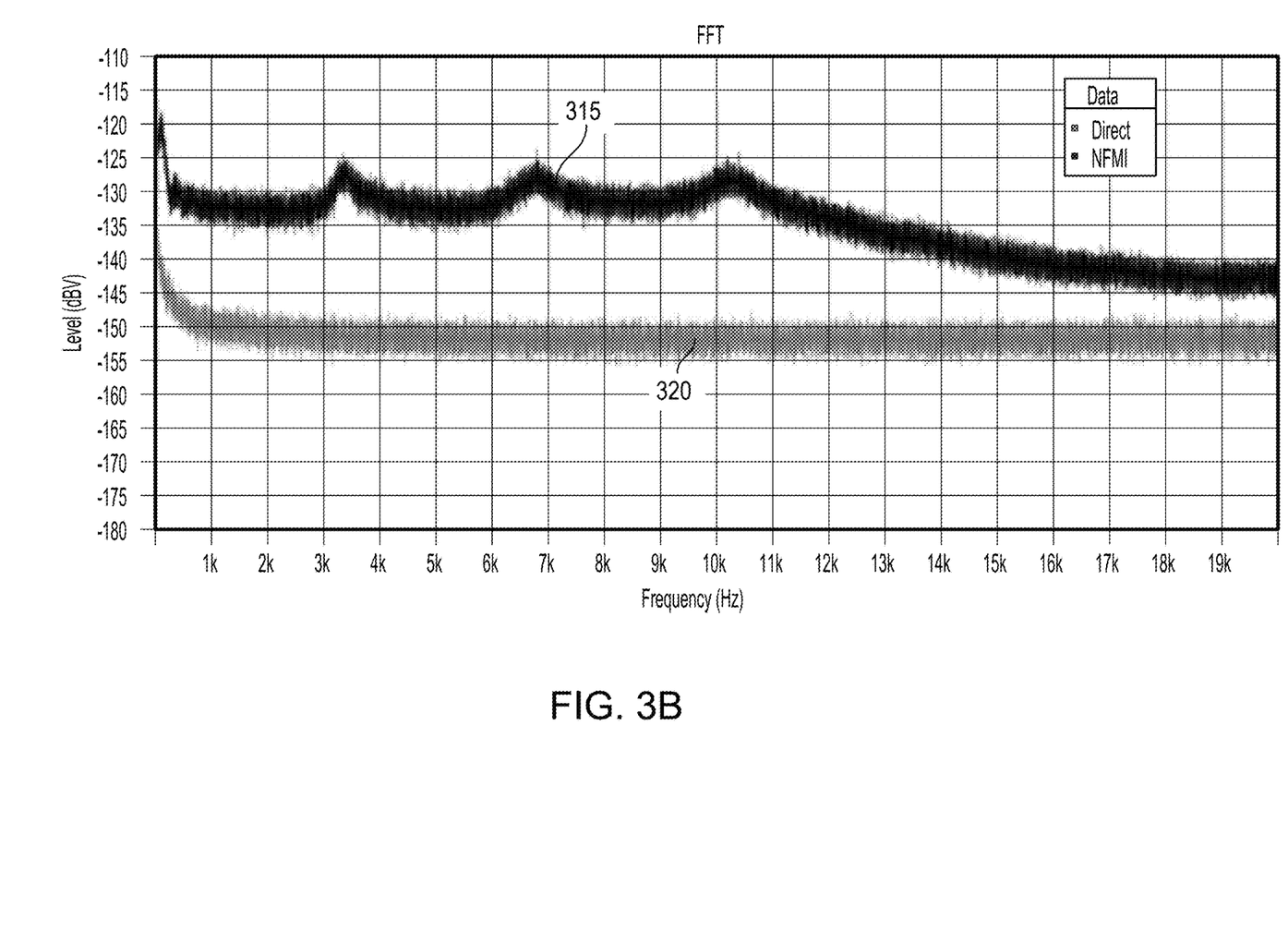

In some implementations, the codec noise internally generated by a codec 205 can result in an audible noise being output by a corresponding acoustic transducer 215. In some cases, this may be particularly noticeable when used in conjunction with an Asynchronous Sample Rate Convertor (ASRC), which is used in wireless transmission systems to synchronize the clocks between the transmitter and receiver devices such as the master and slave earbuds, respectively. FIGS. 3A and 3B show plots illustrating degradation of signal due to codec noise. Specifically, FIG. 3A shows time domain waveforms for signals in the presence and absence of a codec. The trace 305 shows a signal processed by a codec system that includes an ASRC, and the trace 310 shows the same signal in the absence of the codec system. FIG. 4B shows the corresponding spectral plots where the traces 315 and 320 represent signals in the presence and absence of the codec system, respectively. From FIGS. 3A and 3B, it can be seen that a significant amount of broadband codec noise is added by the codec system. Such codec noise can be substantially independent of the input level and may be present even in the absence of any input. This can result in a white noise being output by the acoustic transducers 215 even when the source device 115 is not transmitting any signal over the wireless channel 120. However, given that the noise is substantially independent of the input level, the noise may be masked at high input levels.

Figure 4A:
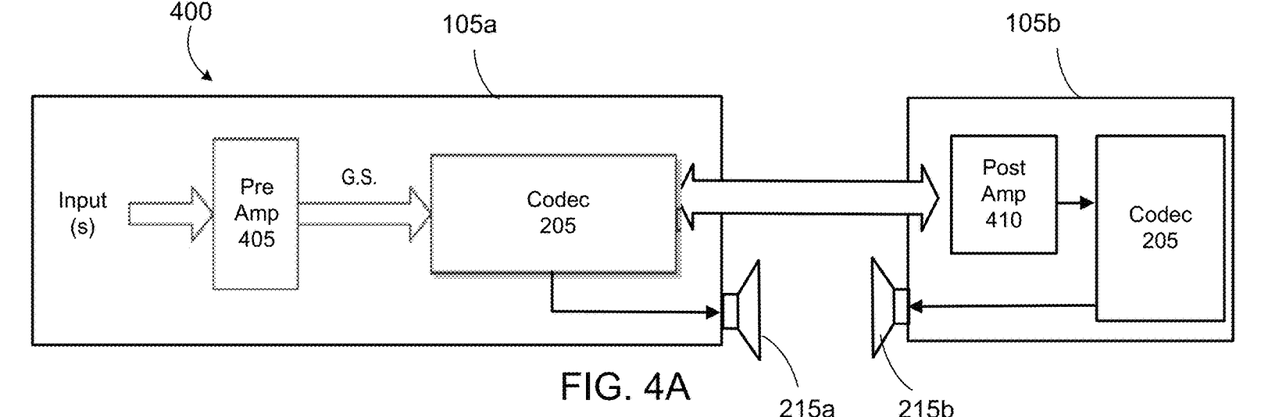
FIGS. 4A-4C are block diagrams of systems for reducing codec noise.
Figure 4B:
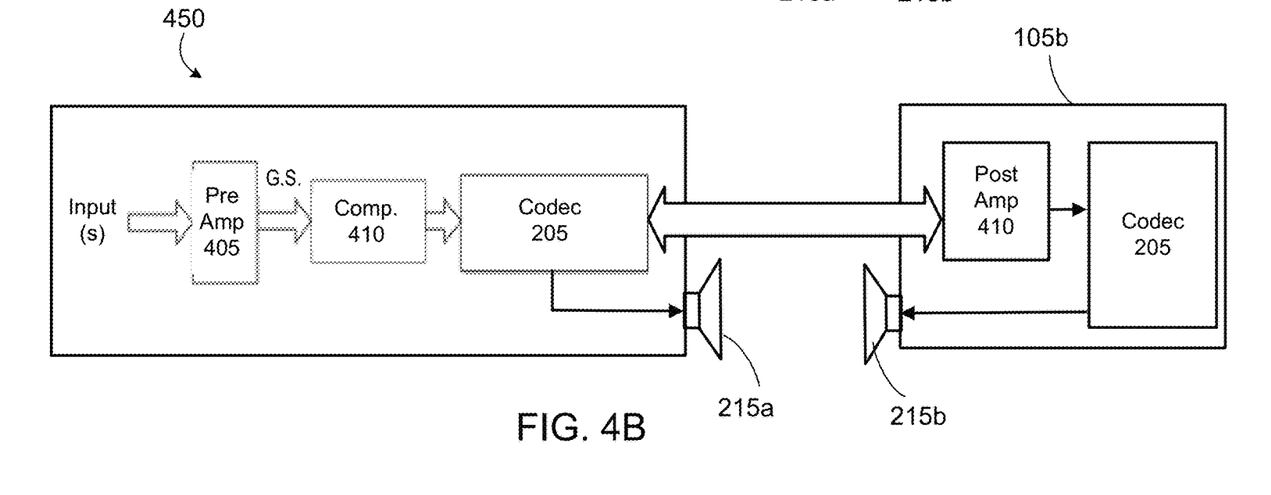
Figure 4C:
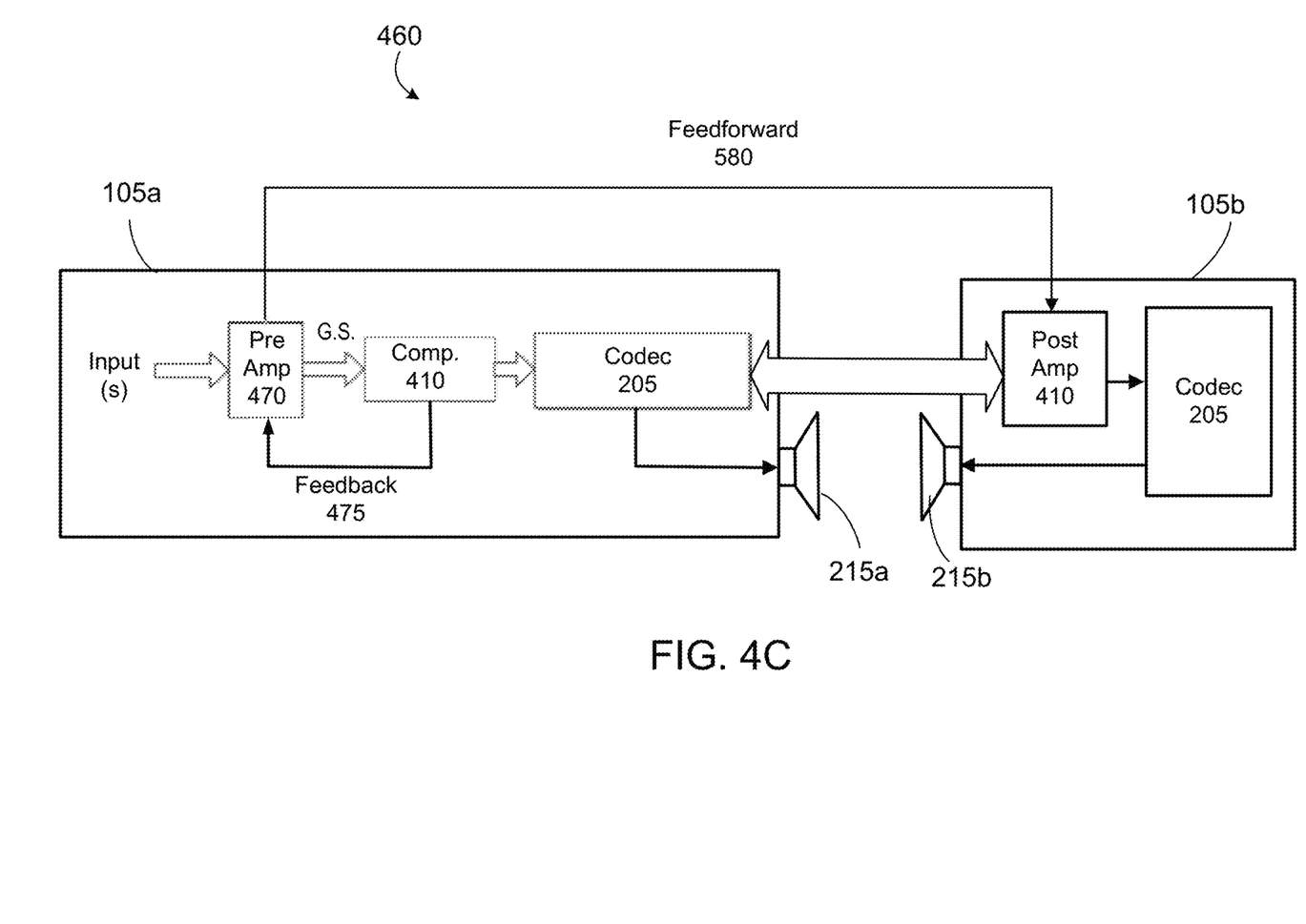

FIGS. 4A-4C are block diagrams of systems for reducing codec noise. FIG. 4A shows a system 400 in which the input signal S at the master earbud 105a is processed by a pre-amplifier 405 that introduces a pre-amplification gain of G such that the input to the codec 205 can be represented as G·S. Assuming the transfer function of the codec 205 to be unity, the output signal transmitted is approximately equal to G·S+N, wherein N is the codec noise added by the codec 205. For the sake of brevity, this example ignores the differences in quality between the input and output of the codec 205. In order to compensate for the pre-amplification introduced by the pre-amplifier 405, the slave earbud 105b includes a post-amplifier 410 that introduces a post-amplification gain of 1/G to the signal transmitted to the slave earbud 105b. Therefore, the output at the slave earbud 105b is given by:

$$\text{Output}=(1/G)(G \cdot S+N)=S+N/G \quad (1)$$

Therefore, the noise component N is attenuated by the factor G, and the overall improvement in signal to noise ratio is G·(S/N), which may be expressed in dB as 20·log (G).

The output noise level can therefore be reduced to a target level by appropriately selecting the value of G. Even though a high value of G may be preferred, in practice, an upper limit of G may depend on available head room in the dynamic range of the digital signal processor. For example, a large value of G may in some cases clip the input to the codec, thereby causing distortion. The value of G can therefore be chosen with respect to a trade-off between input distortion and output codec noise. For example, the value of G can be chosen to be high enough to prevent the codec noise from significantly distorting the perceived output audio quality, but also not so high as to cause the input to the codec to be clipped.

In some implementations, the available headroom in the dynamic range can be an unknown quantity, for example, because it depends on the level of the input audio content. In some cases, a low value of G may still cause the input to the codec to be clipped. Therefore, additional strategies may be used to reduce the chances of the audio being distorted due to a selected value of G. In some implementations, the maximum volume level that can be handled by the system (e.g., the earbud 105a) can be set at a lower level than the capability of the corresponding system. This level may be set, for example, in accordance with a selected value of G such that the input S to the system is at a level that would not be clipped due to the selected value of G. In some cases however, such lowering of overall volume level may not be acceptable, for example, if the audio output by the acoustic transducers are too low for a user. In such cases, a compressor may be used to process the output of the pre-amplifier before such output is provided to a codec.

FIG. 4B shows an example system 450 in which a compressor 410 can be positioned between the pre-amplifier 405 and the codec 205 to reduce the possibility of the input to the codec 205 being clipped. The compressor 410 can perform audio level compression on the pre-amplified signal such that the adjusted pre-amplified signal substantially fits the dynamic range of the codec without being clipped (or without being clipped to an extent that creates noticeable distortions). In some implementations, the compressor 410 may be used in conjunction with a reduction in the maximum volume level that can be handled by the system. In such cases, the use of a compressor 410 may allow for a lower reduction in the maximum volume level thereby allowing for higher values of G to be chosen for the pre-amplifier. This can be used, for example, to make use of the dynamic range headroom available for typical audio content while incorporating a safety mechanism in the audio path for occasional atypical content that might cause clipping and distortion.

In the example of FIG. 4B, using a compressor 410 can allow for the maximum volume of the system 450 to be pushed higher than what is possible in the example of FIG. 4A. This may be possible, for example, by compensating for the pre-amplification G by a compression process performed by the compressor 410. However, pushing the maximum volume too high for a high value of G can in some cases result in over-compression of the audio signal, which in turn may lead to a perceptible loss in signal quality. In some implementations, this may be mitigated, at least to some extent, using an adaptive system, an example 460 of which is shown in FIG. 4C. The system 460 includes a pre-amplifier 470, an amplification factor of which can be adjusted in accordance with a feedback signal 475 from the compressor 410. Such a system may be used for an efficient use of the available headroom to generate high quality audio playback while potentially reducing the codec noise to imperceptible levels.

In some implementations, the pre-amplification gain G is adaptively varied in accordance with an operating state of the compressor 410. For example, the compressor 410 may track the incoming signal level and the available dynamic range headroom before applying compression, and change an operating state accordingly. Information about these operating state parameters can be fed back to the pre-amplifier 470 via the feedback signal 475, and in turn used by the pre-amplifier 470 to adjust the pre-amplification gain G. For instance, if the compressor is close to a pre-determined over compression threshold, the pre-amplification G can be reduced (with an associated time constant) until a target compressor operating state is achieved. Conversely if the input audio level is too low, the pre-amplification gain G can be ramped up (with an associated time constant) to achieve a target operating state for the compressor 410. In some implementations, the feedback signal 475 can include one or more additional operating state metrics (e.g., a metric indicating that the system is getting close to the compressor limit) that may be used in adjusting the pre-amplification gain. In some cases, such additional metrics may be used to achieve a target overall system dynamics.

The adaptively selected pre-amplification gain G can be communicated to the receiving device (e.g., the slave earbud 105b) such that the post-amplification gain of the corresponding post-amplifier 410 can be adjusted accordingly. This can be done, for example, using a feedforward signal 480 that may be transmitted over the wireless channel between the two acoustic devices. In some implementations, by setting the post-amplification gain to be an inverse of the pre-amplification gain G, the overall system path gain may be held substantially close to unity. In some implementations, this can include adjusting the gain of the post-amplifier 410 after a time period to account for any propagation delay between the pre-amplifier 470 and the post-amplifier 410. In some implementations, an independent audio level detector may be used at the receiving acoustic device for determination of the post-amplification gain. In some cases, a feedforward signal 480 may thus be avoided.

In implementations where the acoustic devices (e.g., the earbuds 105) process and output stereo audio, a dynamic gain adjustment on one of the stereo channels may be duplicated synchronously on the other channel, for example, to maintain a target audio spatial image. For such stereo audio, the corresponding codec systems may also introduce, for example, a time delay and a non-flat frequency response that may be equalized between the channels to maintain the target audio spatial image.

Figure 5A:
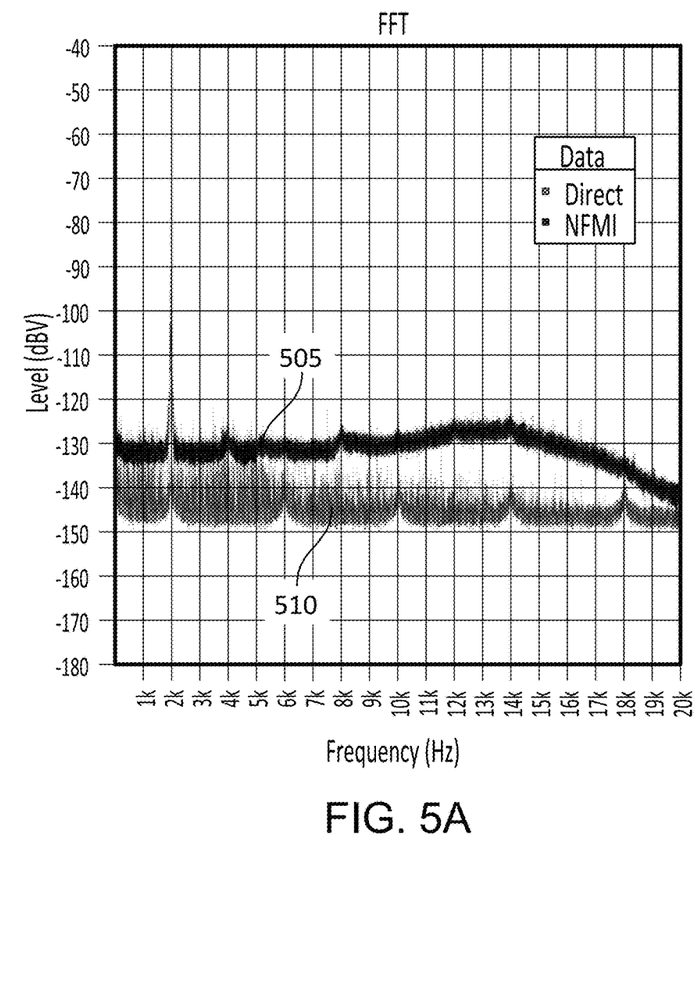
FIGS. 5A and 5B show plots illustrating reduction of codec noise.
Figure 5B:
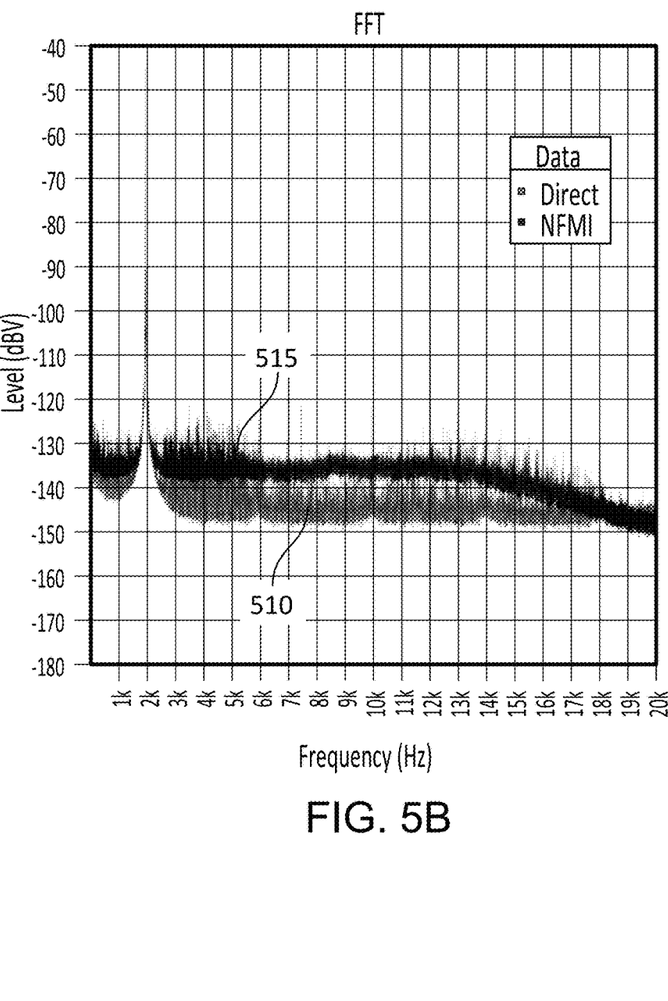

FIGS. 5A and 5B show plots illustrating reduction of codec noise using technology described herein. Specifically FIG. 5A shows the spectrum 505 of codec noise in the absence of the technology described herein, as compared to a spectrum 510 of a direct wired equivalent signal in the absence of a codec. The spectra were generated for a 2 KHz tone. FIG. 5B shows the spectrum 515 of the codec noise compared to the same baseline spectrum 510 when the codec noise was reduced using the system 400 depicted in FIG. 4A. In this example, a pre-amplification gain of G=3 was used to improve the SNR by approximately 10 dB.

Using a pre-amplification gain to boost an input signal to a codec, and compensating for the gain at a receiving device may therefore reduce at least some adverse effects of associated codec noise. Another source of codec-introduced distortion can be a reduction in dynamic range due to a lower number of bits used in a codec. For example, if an acoustic device (e.g., a master earbud 105) receives audio signals from a source device over a Bluetooth® link, the corresponding data samples may be represented using 16 bits. On the other hand, a codec such as the ITU G.722 codec uses 14 bits to represent the data samples. Compared to the 16 bit audio, this results in about 12 dB of reduction in the available dynamic range. While such a reduction may be acceptable for some audio signals (e.g., speech), the reduction may cause a perceptible loss in audio quality in some high dynamic range content such as music. In some implementations, distortions due to such reduction in available dynamic range may be mitigated, at least in part, by selecting the pre-amplification gain to efficiently use the available dynamic range. In some cases, this may help in producing a high quality audio reproduction by an acoustic device that uses a codec.

Figure 6A:
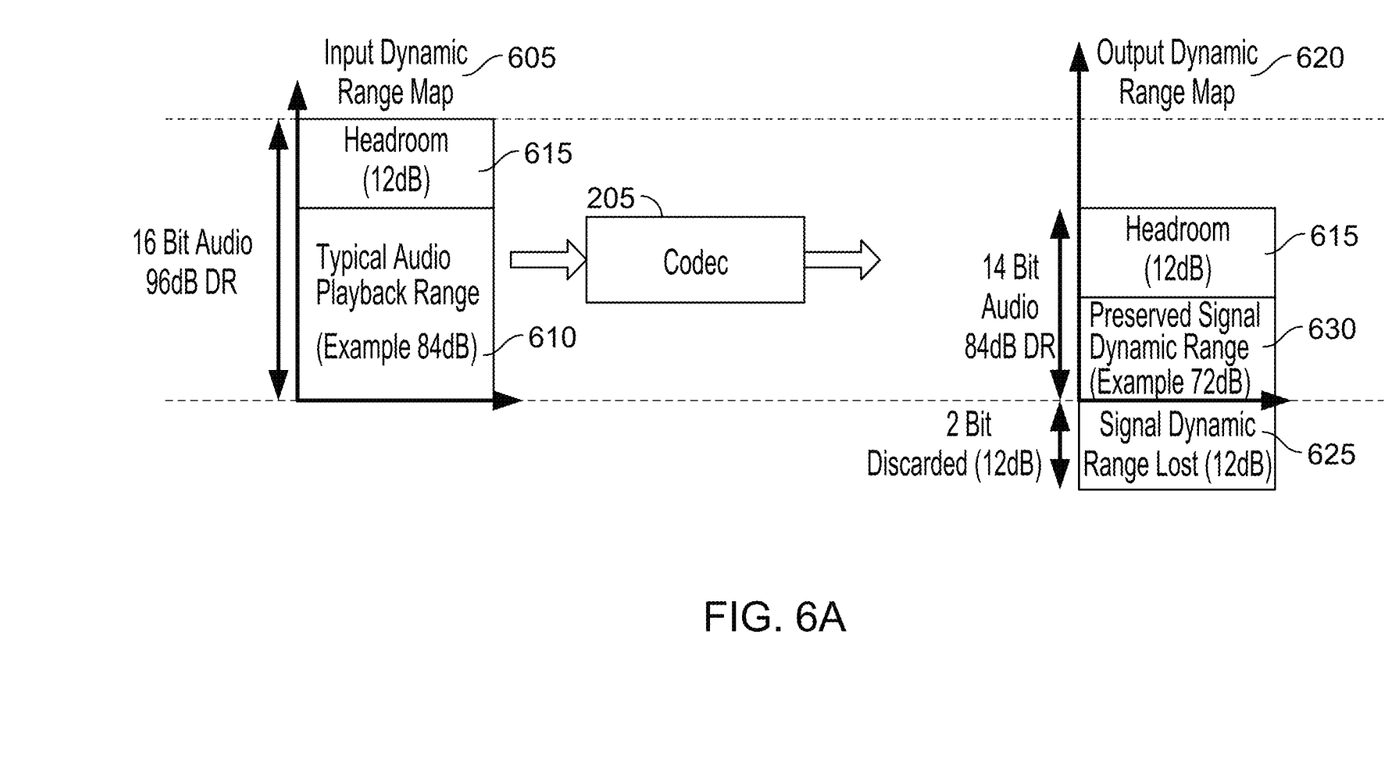
FIG. 6A illustrates dynamic range reduction due to codec usage.

FIG. 6A shows schematic illustrations of dynamic range reduction due to certain codec usage. Plot 605 illustrates a dynamic range map of a 16 bit input audio signal. The 16 bit audio has a dynamic range of approximately 96 dB, of which 84 dB is assumed to be occupied by the input audio signal 610 in this example. Accordingly, a headroom 615 of 12 dB is available on the input side of the codec 205. Due to the 12 dB reduction associated with the 14 bit codec 205, 12 dB of available dynamic range is lost, as illustrated by the plot 620 on the output side of the codec 205. This causes the entire signal to be shifted down, thereby causing a 12 dB segment 625 at the bottom to be lost. This in turn results in only 72 dB of effective signal dynamic range 630 at the output. The headroom 615 however still remains unaffected at 12 dB. The example of FIG. 6A thereby represents an inefficient usage of the dynamic range of the system.

In some implementations, the pre-amplification gain G applied to the input signal to the codec 205 can be selected to promote a more efficient use of the available dynamic range.

Figure 6B:
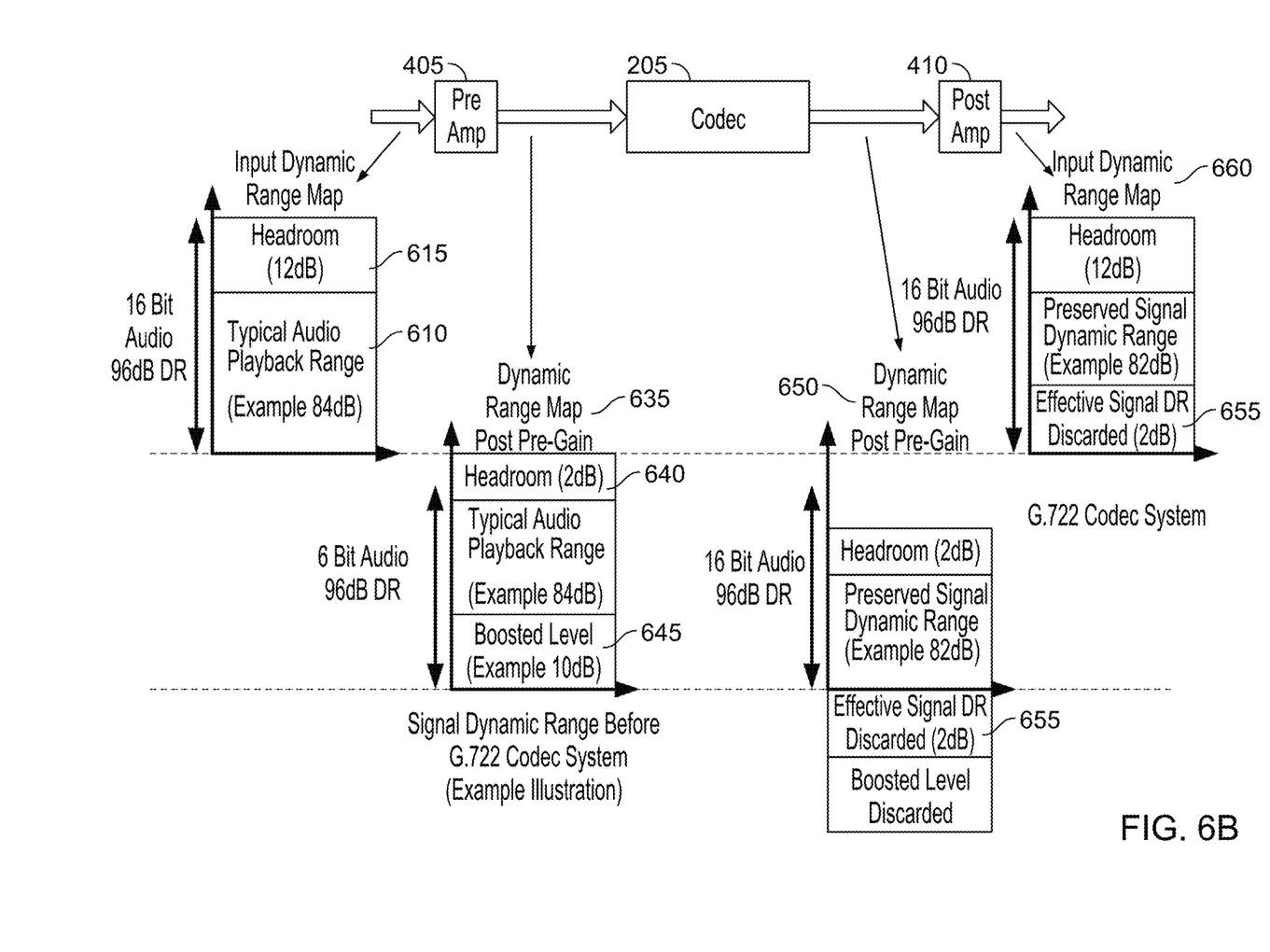
FIG. 6B illustrates improvement in dynamic range reduction.

FIG. 6B shows schematic illustrations of improvement in dynamic range reduction. In the example, the input signal from the example of FIG. 6A is boosted by a pre-amplification gain value G. In this example G=3, which corresponds to 10 dB of pre-amplification 645. The resulting dynamic range map 635 shows that the available headroom 640 is reduced by an equivalent amount (10 dB), resulting in an available headroom of 2 dB at the input of the codec 205. The 14 bit codec 205 (ITU G.722, in this example) shifts down the signal by 12 dB, and the plot 650 illustrates the resulting signal dynamic range at the output of the codec 205. The final dynamic range map 660 at the output of a post-amplifier 410 shows the signal at the original level with a corresponding loss 655 in the effective dynamic range. In this example, the post-amplifier 410 introduces a post-amplification gain factor of 1/G and other equalization parameters as needed to maintain unity gain through the entire signal chain. Because the 12 dB discarded at the output of the codec 205 includes the 10 dB pre-amplification 645, the portion of the input audio signal 610 that is discarded in the final map 660 amounts to only 2 dB. This represents a 10 dB improvement in the amount of potentially useful signal discarded, as compared to the corresponding 12 dB in the example of FIG. 6A.

Therefore, the pre-amplification gain (and consequently in some cases, the post-amplification gain, and one or more equalization parameters) may be selected based on the available headroom to improve the dynamic range performance of corresponding acoustic devices. In some cases, the headroom management, as described with reference to FIG. 6B, may be implemented in conjunction with the codec-noise reduction techniques (e.g., the pre- and post-amplification gain adjustment), for example, as a trade-off between headroom and perceived audio quality. Even though selecting a pre-amplification gain for one purpose (e.g., to reduce codec noise) may naturally help the other purpose (efficient use of dynamic range, in this example), the operating parameters of an associated system (e.g., the pre-amplification gain) may be selected based on the purpose that is of higher importance in a given application.

Figure 7:
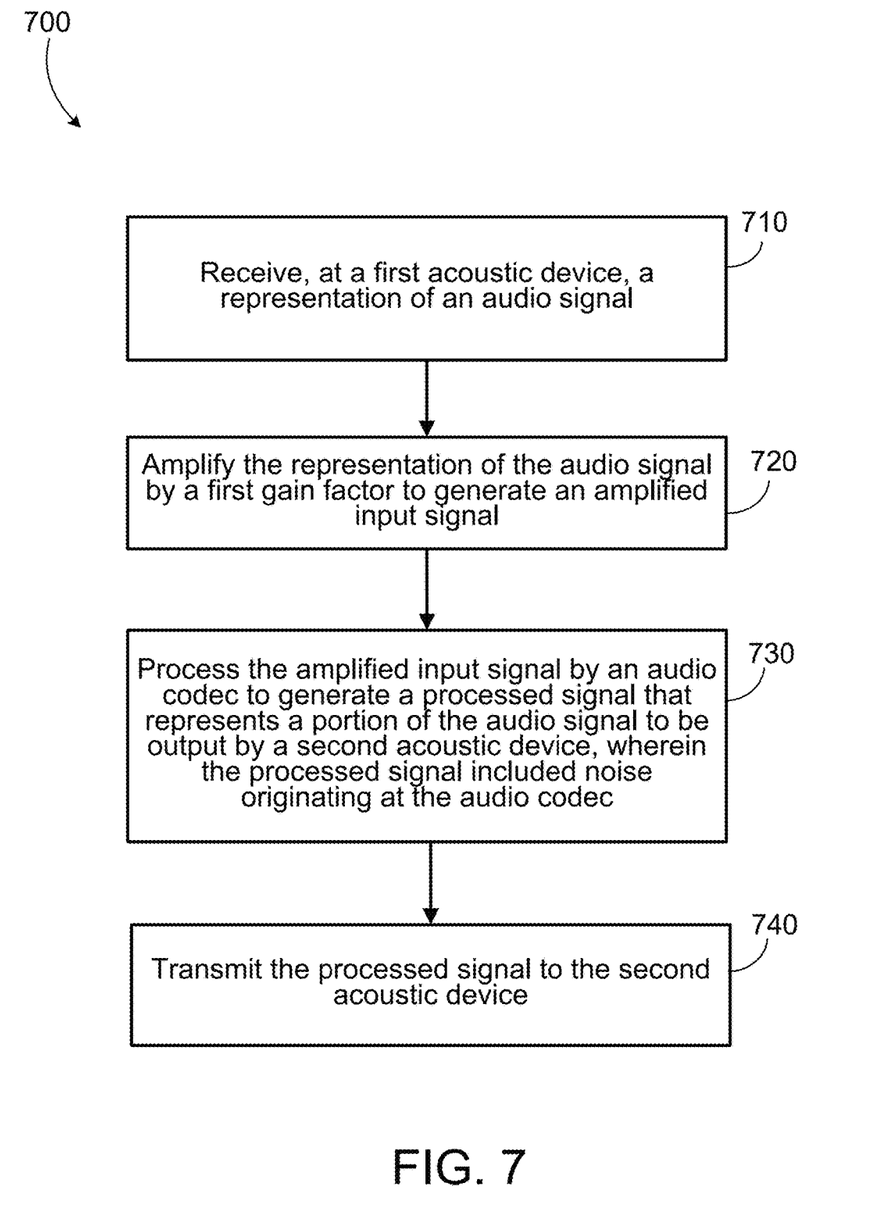
FIG. 7 is a flowchart of an example process for reducing codec noise.

FIG. 7 is a flowchart of an example process 800 for reducing codec noise that may be generated by, for example, the codec 205 of FIGS. 4A-4C. In some implementations, at least a portion of the process 700 may be executed by one or modules of an acoustic device. For example, the process 700 may be executed, at least in part, by one or more modules of the master earbud 105a and/or slave earbud 105b, as illustrated in FIGS. 4A-4C. Operations of the process 700 include receiving, at a first acoustic device, a representation of an audio signal (710). The first acoustic device can be an earbud such as the master earbud 105a described above. The audio signal can include signals for two or more audio channels. For example, the audio signal can include an A2DP data stream that includes data corresponding to audio signals for two channels (e.g., left speaker and right speaker) of an audio system. The audio signal can be generated by a source device such as the source device 115 described with reference to FIG. 1. The source device can include a media playing device capable of generating the audio signal in accordance with a Bluetooth® profile such as the A2DP profile.

Operations of the process 700 also include amplifying the representation of the audio signal by a first gain factor to generate an amplified input signal (720). The first gain factor can be substantially equal to the pre-amplification gain described above with reference to FIGS. 4A-4C. In some implementations, the first gain factor can be selected such that the amplified input signal does not exceed a dynamic range of a system of which the first acoustic device is a part. For example, the first gain factor can be selected such that the selected gain factor is compatible with corresponding dynamic ranges of various devices and channels in the overall audio path of the system.

In some implementations, the first gain factor can be selected adaptively in accordance with the received representation of the audio signal. For example, this can include detecting a dynamic range of the received representation of the audio signal, and determining available dynamic range headroom. The headroom can be determined as a difference between a dynamic range of the system, and the dynamic range of the received representation of the audio signal. The first gain factor can then be selected such that an associated amount of amplification does not exceed the available dynamic range headroom.

Operations of the process 700 further include processing the amplified input signal by an audio codec to generate a processed signal that represents a portion of the audio signal to be output by a second acoustic device (730). The processed signal includes codec-noise originating at the audio codec. In some implementations, the audio codec can be an adaptive differential pulse code modulation (ADPCM) codec. The processed signal can include noise originating at an asynchronous sample rate converter that is used in conjunction with the audio codec. In some implementations, prior to processing by the audio codec, the amplified input signal is compressed in accordance with a dynamic range of the system.

Operations of the process 700 also include transmitting the processed signal to the second acoustic device (740). The second acoustic device may then receive a representation of the processed signal, and compensate for the first gain factor by amplifying the representation of the processed signal by a second gain factor to generate a compensated signal. The compensated signal is then output at the second acoustic device through an acoustic transducer. The second acoustic device can be an acoustic earbud such as the slave earbud 105b described above. The second gain factor can be substantially equal to the post-amplification gain described above. For example, the second gain factor can be substantially an inverse of the first gain factor. In some implementations, information indicative of an adaptively selected gain factor may be transmitted to the second acoustic device through a wireless link.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Other embodiments and applications not specifically described herein are also within the scope of the following claims. For example, in cases where the codec generated noise has a non-uniform spectral distribution frequency shaping may also be applied to the pre-amplifier gain. In some cases, such frequency shaping may help in avoiding boosting the signal unnecessarily in frequency regions where the noise is low or imperceptible. This can be used, for example, in situations where the codec generated noise has significant high frequency energy, whereas typical audio content has a relatively small crest factor at such frequencies, and hence a larger headroom to spare.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A computer-implemented method comprising:
   receiving, at a first acoustic device, a representation of an audio signal;
   amplifying the representation of the audio signal by a first gain factor to generate an amplified input signal;
   processing the amplified input signal by an audio codec comprising one or more processors to generate a processed signal that represents a portion of the audio signal to be output by a second acoustic device remote with respect to the first acoustic device, wherein the processed signal includes noise originating at the audio codec; and
   transmitting the processed signal to the second acoustic device over a wireless link,
   wherein the processing comprises bit rate compression in accordance with a data transfer capacity of the wireless link.

2. The method of claim 1, further comprising:
   receiving, at the second acoustic device, a representation of the processed signal;
   compensating for the first gain factor by amplifying the representation of the processed signal by a second gain factor to generate a compensated signal; and
   outputting the compensated signal at the second acoustic device.

3. The method of claim 2, wherein the second gain factor is substantially an inverse of the first gain factor.

4. The method of claim 1, wherein the audio codec is an adaptive differential pulse code modulation (ADPCM) codec.

5. The method of claim 1, wherein the processed signal also includes noise originating at an asynchronous sample rate converter used in conjunction with the audio codec.

6. The method of claim 1, wherein the first gain factor is selected such that the amplified input signal does not exceed a dynamic range of a system in which the audio codec is disposed.

7. The method of claim 1, further comprising compressing the amplified input signal in accordance with a dynamic range of a system in which the audio codec is disposed.

8. The method of claim 1, wherein the first gain factor is selected adaptively in accordance with the received representation of the audio signal.

9. The method of claim 8, comprising:
   detecting a dynamic range of the received representation of the audio signal;
   determining available dynamic range headroom as a difference between a dynamic range of a system in which the audio codec is disposed, and the dynamic range of the received representation of the audio signal; and
   selecting the first gain factor such that an associated amount of amplification does not exceed the available dynamic range headroom.

10. The method of claim 8, further comprising transmitting information indicative of the adaptively selected gain factor to the second acoustic device.

11. The method of claim 1, wherein the first and second acoustic devices are earphones that are connected to one another over a wireless link.

12. The method of claim 1, wherein the first gain factor is a function of frequency.

13. A system comprising:
   a first acoustic device configured to receive a representation of an audio signal, the first acoustic device comprising:
      an amplifier configured to amplify the representation of the audio signal by a first gain factor to generate an amplified input signal,
      an audio codec comprising one or more processors, the audio codec configured to process the amplified input signal to generate a processed signal that represents a portion of the audio signal to be output by a second acoustic device remote with respect to the first acoustic device, wherein the processed signal includes noise originating at the audio codec, and
      a transmitter for transmitting the processed signal to the second acoustic device over a wireless link,
      wherein the processing comprises bit rate compression in accordance with a data transfer capacity of the wireless link.

14. The system of claim 13, further comprising:
   the second acoustic device configured to receive a representation of the processed signal, the second acoustic device comprising:

an amplifier configured to compensate for the first gain factor by amplifying the representation of the processed signal by a second gain factor to generate a compensated signal, and a receiver codec configured to process the compensated signal to output the compensated signal at the second acoustic device.

15. The system of claim 14, wherein the second gain factor is substantially an inverse of the first gain factor.

16. The system of claim 13, wherein the audio codec is an adaptive differential pulse code modulation (ADPCM) codec.

17. The system of claim 13, wherein the processed signal also includes noise originating at an asynchronous sample rate converter used in conjunction with the audio codec.

18. The system of claim 13, wherein the first gain factor is selected such that the amplified input signal does not exceed a dynamic range of the system.

19. The system of claim 13, further comprising a compressor for compressing the amplified input signal in accordance with a dynamic range of the system.

20. The system of claim 13, wherein the first gain factor is selected adaptively in accordance with the received representation of the audio signal.

21. The system of claim 20, wherein the first acoustic device is further configured to:

detect a dynamic range of the received representation of the audio signal;

determine available dynamic range headroom as a difference between a dynamic range of the system and the dynamic range of the received representation of the audio signal; and select the first gain factor such that an associated amount of amplification does not exceed the available dynamic range headroom.

22. The system of claim 21, wherein information indicative of the adaptively selected gain factor is transmitted to the second acoustic device.

23. The system of claim 13, wherein the first and second acoustic devices are earphones that are connected to one another over a wireless link.

24. The system of claim 13, wherein the first gain factor is a function of frequency.

25. A machine-readable storage device having encoded thereon computer readable instructions for causing one or more processors to perform operations comprising:

receiving a representation of an audio signal;

amplifying the representation of the audio signal by a first gain factor to generate an amplified input signal;

processing the amplified input signal to generate a processed signal that represents a portion of the audio signal to be output by an acoustic device that is remote from the one or more processors, wherein the processed signal includes noise originating at an audio codec; and providing the processed signal for transmission to the acoustic device over a wireless link, wherein the processing comprises bit rate compression in accordance with a data transfer capacity of the wireless link.

* * * * *